(12) United States Patent
Murray Howells (10) Patent No.: US 11,355,914 B2
(45) Date of Patent: Jun. 7, 2022

(54) RELAY PROTECTION

(71) Applicant: APOLLO FIRE DETECTORS LIMITED, Havant (GB)

(72) Inventor: Dale Murray Howells, Havant (GB)

(73) Assignee: APOLLO FIRE DETECTORS LIMITED, Havant (GB)

( * ) Notice: Subject to any disclaimer, the term of this patent is extended or adjusted under 35 U.S.C. 154(b) by 0 days.

(21) Appl. No.: 16/959,874

(22) PCT Filed: Jan. 7, 2019

(86) PCT No.: PCT/GB2019/050030
§ 371 (c)(1),
(2) Date: Jul. 2, 2020

(87) PCT Pub. No.: WO2019/135092
PCT Pub. Date: Jul. 11, 2019

(65) Prior Publication Data
US 2020/0335962 A1    Oct. 22, 2020

(30) Foreign Application Priority Data

Jan. 5, 2018  (GB) ...................................... 1800191

(51) Int. Cl.
*H02H 3/00*    (2006.01)
*H02H 3/08*    (2006.01)
(Continued)

(52) U.S. Cl.
CPC ............ *H02H 3/08* (2013.01); *H02H 1/0007* (2013.01); *H03K 5/24* (2013.01)

(58) Field of Classification Search
None
See application file for complete search history.

(56) References Cited

U.S. PATENT DOCUMENTS 4,401,894 A * 8/1983 Weisner ................. H02J 9/061
                                                              307/64
5,243,336 A    9/1993 Noonan et al.
(Continued)

FOREIGN PATENT DOCUMENTS

EP    0590340    4/1994

OTHER PUBLICATIONS

International Search Report and Written Opinion dated Mar. 22, 2019, in connection with International Application No. PCT/GB2019/050030 (10 pages).
(Continued)

*Primary Examiner* — Stephen W Jackson
(74) *Attorney, Agent, or Firm* — McCracken & Gillen LLC (57) ABSTRACT

A relay protection device is disclosed for use with a magnetic latching relay, the relay having two stable states. The relay comprises an electromagnetic device which under the effect of a switching impulse current, causes the relay to switch from one of the states to the other. The relay protection device comprises a current detector for connection with electrical control contacts of the relay, which measures a current induced by the switching mechanism, a comparator operable to determine if the current exceeds a predetermined threshold, and a controller for connection with the electrical control contacts and, based on the determination of the comparator, operable to apply a retention voltage across the electrical control contacts so as to cause the electromagnetic device to generate a magnetic field to retain the switching mechanism in its current state.

11 Claims, 6 Drawing Sheets

(51) Int. Cl.
*H02H 1/00* (2006.01)
*H03K 5/24* (2006.01)

(56) References Cited

U.S. PATENT DOCUMENTS

| | | | |
|---|---|---|---|
| 5,327,068 A * | 7/1994 | Lendrum | H02J 7/1461 320/136 |
| 6,017,017 A | 1/2000 | Lutz et al. | |
| 6,366,766 B1 * | 4/2002 | Dalebroux | H04B 1/109 330/298 |
| 2007/0146959 A1 | 6/2007 | Morita | |
| 2008/0036561 A1 | 2/2008 | Hartinger et al. | |
| 2013/0083444 A1 | 4/2013 | Barnes et al. | |
| 2014/0002093 A1 | 1/2014 | Elliott et al. | |
| 2015/0204946 A1 | 7/2015 | Kinoshita et al. | |

OTHER PUBLICATIONS

Manu Balakrishnan, and Navaneeth Kumar N., Texas Instruments, Detection of Plunger Movement in DC Solenoids, Jun. 2015 (10 pages).

* cited by examiner

RELAY PROTECTION

FIELD

The present disclosure relates to the provision of a device for use with magnetic latching relays.

BACKGROUND

UL864 is an industry standard which specifies performance requirements for control units and accessories for fire alarm systems. One of these requirements is that an accessory or control unit for a fire alarm system should be able to withstand a jarring test. The specified jarring test consists of a metal pendulum swinging against a wooden board on which the unit is mounted. The impact force, imparted by the resultant impact, can be a g-force of up to 100 g, where g is the acceleration due to gravity. G-force describes the force acting on a body as a result of the acceleration of a body under gravity.

Control units for use in fire alarm systems often contain relays. A risk arises that a relay may change state if subjected to mechanical impact, such as jarring. This could be a safety issue. This provides an underlying reason for the jarring test as specified in UL864—the test is intended to establish that a relay in a control unit is capable of maintaining its current state, during the test.

Magnetic latching relays are commonly used in fire alarm systems. This is because they require no energising power unless they are to change state. This has specific advantage to fire loop systems, for which it is desirable to limit power consumption.

A magnetic latching relay relies on magnetism to hold the position of an armature of the relay against a ferrous core of the electromagnet, or another ferrous contact within the relay. An impulse force above a certain threshold can be sufficient to overcome the magnetic attraction between the magnet and the ferrous core or ferrous contact, and to cause the relay to be urged out of one stable switching state and into another.

Generally, commercially available relays will specify the level of this force, so that due notice can be given to this by system designers. That would avoid installation of relays in environments in which impacts may be encountered above the specified threshold, which could give rise to anomalous relay switching.

Making a relay sufficiently robust, so that it has a high resistance to impulse forces, can mean that a relay is bulky, heavy and difficult to accommodate in installations. There is thus a temptation for installers to use relays which are not sufficiently robust for the intended purpose (i.e. their resistance to impulse force is lower than desired), as a compromise between the bulkiness of a relay and the need for it to be accommodated within a limited space.

Other approaches have been contemplated. For example, the enclosure of a relay can include design features intended to dampen forces imparted on the relay. However, mechanical solutions such as shock absorbing foam can be impractical as they can be costly and/or difficult to manufacture.

SUMMARY OF THE INVENTION

An aspect of the present invention provides a relay protection device for use with a magnetic latching relay, the magnetic latching relay comprising a pair of contacts and a switching mechanism coupled with at least one of the contacts, the switching mechanism having two states of equilibrium, one of the states corresponding with the contacts being in electrical contact, the other corresponding to the contacts not being in electrical contact, and an electromagnetic device operable to urge, under the effect of a switching impulse current, the switching mechanism from one of the states of equilibrium to the other, the switching impulse current being supplied to the electromagnetic device via electrical control contacts, the relay protection device comprising a current detector for connection with the electrical control contacts and operable to measure a current induced by the switching mechanism, a comparator operable to determine if the current exceeds a predetermined threshold, and a controller for connection with the electrical control contacts and, based on the determination of the comparator, operable to apply a retention voltage across the electrical control contacts so as to cause the electromagnetic device to generate a magnetic field to retain the switching mechanism in its current state.

In one embodiment, the current detector is operable to detect the current induced by the switching mechanism by measuring a voltage across the electrical control contacts.

In one embodiment, the current induced by the switching mechanism is measured at a time when the switching impulse current is zero.

In one embodiment, the switching mechanism comprises at least one magnet.

In one embodiment, a movement of the switching mechanism induces the current induced by the switching mechanism.

In one embodiment, a polarity of the current induced by the switching mechanism depends on a direction of the movement of the switching mechanism.

Another aspect of the present invention provides a method of providing relay protection in a magnetic latching relay, the magnetic latching relay comprising a pair of contacts and a switching mechanism coupled with at least one of the contacts, the switching mechanism having two states of equilibrium, one of the states corresponding with the contacts being in electrical contact, the other corresponding to the contacts not being in electrical contact, and an electromagnetic device operable to urge, under the effect of a switching impulse current, the switching mechanism from one of the states of equilibrium to the other, the switching impulse current being supplied to the electromagnetic device via electrical control contacts, the method comprising measuring a current induced by the switching mechanism, determining if the current exceeds a predetermined threshold and, based on the determination, applying a retention voltage across the electrical control contacts so as to cause the electromagnetic device to generate a magnetic field to retain the switching mechanism in its current state.

In one embodiment, the current induced by the switching mechanism is measured by measuring a voltage across the electrical control contacts.

In one embodiment, the current induced by the switching mechanism is measured at a time when the switching impulse current is zero.

In one embodiment, the switching mechanism comprises at least one magnet.

In one embodiment, a movement of the switching mechanism induces the current induced by the switching mechanism.

In one embodiment, a polarity of the current induced by the switching mechanism depends on a direction of the movement of the switching mechanism.

Another aspect of the present invention provides a magnetic latching relay operable to implement the methods described above.

DETAILED DESCRIPTION OF THE EMBODIMENTS

Figure 1:
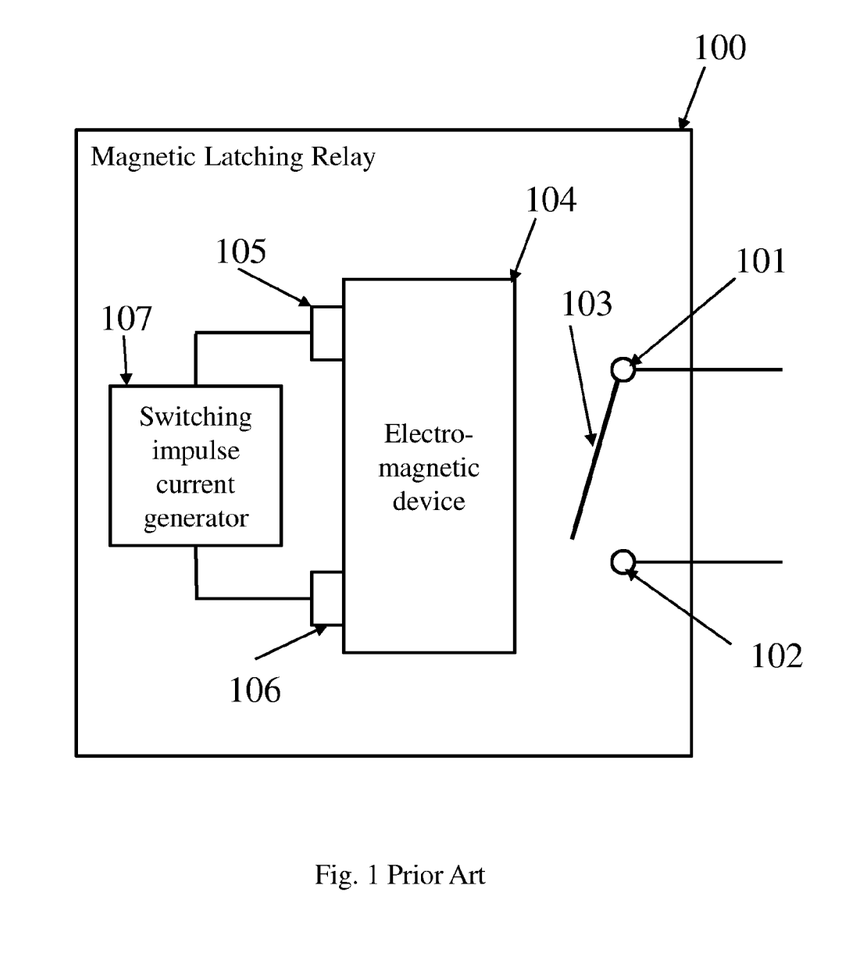
FIG. 1 illustrates a magnetic latching relay as common in the art.

FIG. 1 illustrates a magnetic latching relay 100 as common in the prior art. The magnetic latching relay comprises a pair of contacts 101, 102 and a switching mechanism 103 coupled with at least one of the pair of contacts 101, 102.

The switching mechanism 103 has two states of equilibrium. One state of equilibrium SE1 corresponds with the pair of contacts 101 102 being in electrical contact. The other state of equilibrium SE0 corresponds to the contacts not being in electrical contact.

Figure 2:
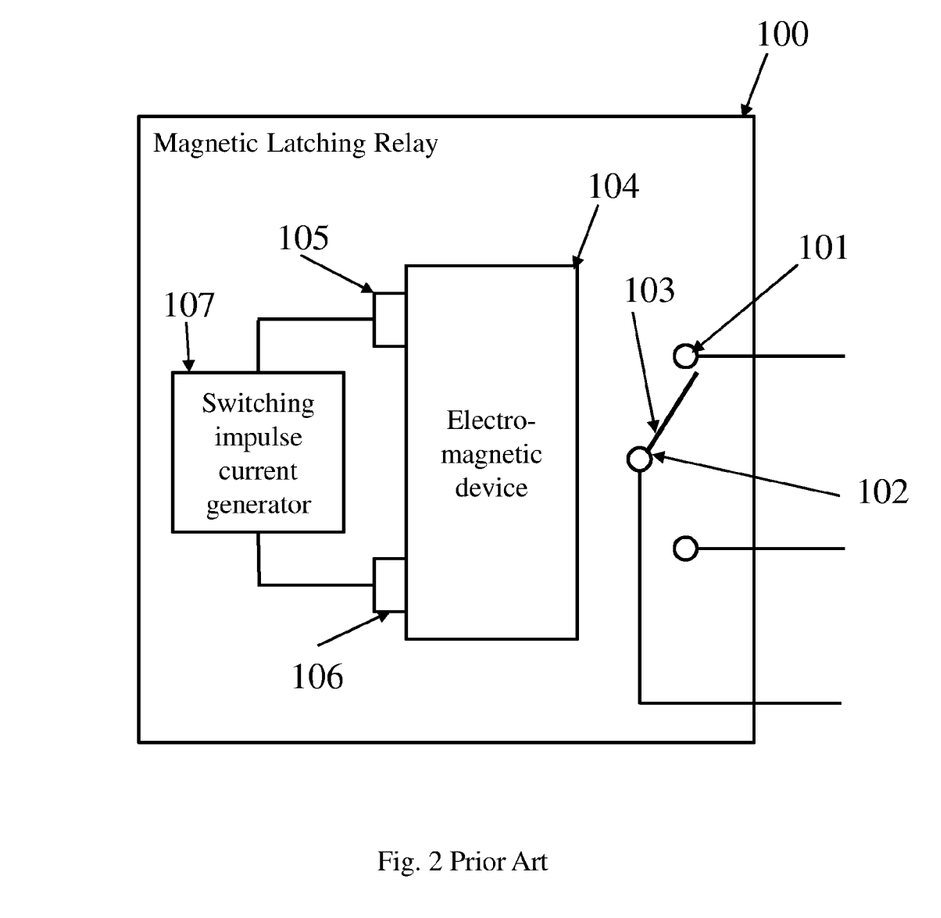
FIG. 2 illustrates a magnetic latching relay as common in the art.

In one arrangement, the pair of contacts 101 102 and the switching mechanism 103 form part of single pole, single throw (SPST) switch arrangement as illustrated in FIG. 1. In an alternative arrangement, the pair of contacts 101 102 and the switching mechanism 103 form part of single pole double throw (SPDT) switch arrangement as illustrated in FIG. 2. However, the pair of contacts 101 102 and the switching mechanism 103 are not limited to being included in SPST and SPDT arrangements and can form part of further switch arrangements known in the art.

The magnetic latching relay 100, as shown in FIG. 1 and FIG. 2, further comprises an electromagnetic device 104. In one arrangement, the electromagnetic device 104 comprises of one coil (single coil latching relay). Optionally, the coil is wound around a ferrous core. In an alternative arrangement, the electromagnetic device 104 comprises of two coils (dual coil latching relay). Optionally, the coils are wound around ferrous cores.

The electromagnetic device 104 comprises of electrical control contacts 105 106 to receive a switching impulse current $I_S$ generated by the switching impulse current generator 107. The switching impulse current $I_S$ may involve the application of a switching impulse voltage $V_S$ to the electrical control contacts 105 106.

The switching impulse current $I_S$ causes at least one coil of the electromagnetic device to generate a magnetic field. This magnetic field causes the switching mechanism 103 change from one state of equilibrium to another state of equilibrium.

For example, in FIG. 1, if the switching mechanism 103 is initially in state SE1 where the pair of contacts 101 and 102 are in electrical contact, the generated magnetic field due to the switching impulse current $I_S$ will cause the switching mechanism to move from state SE1 to state SE0, where the pair of contacts 101 and 102 are not in electrical contact.

Therefore, on receiving the switching impulse current $I_S$, the electromagnetic device 104 generates a magnetic field operable to urge the switching mechanism 103 from one of the states of equilibrium to the other.

For example, in FIG. 1, on receiving the switching impulse current $I_S$, the electromagnetic device 104 generates a magnetic field operable to urge the switching mechanism 103 from state SE1 to state SE0.

Alternatively, for example, in FIG. 1, on receiving the switching impulse current $I_S$, the electromagnetic device 104 generates a magnetic field operable to urge the switching mechanism 103 from state SE0 to state SE1.

The time period during which the switching impulse current $I_S$ is greater than zero and/or the electromagnetic device 104 generates a magnetic field to move the switching mechanism 103 from one state of equilibrium to the other is referred to as the switching period.

When the switching impulse current $I_S$ has reduced to zero and/or the electromagnetic device 104 no longer generates a magnetic field to move the switching mechanism, the switching mechanism 103 is maintained in its current state of equilibrium. The time period during which the switching impulse current $I_S$ is zero and/or the electromagnetic device 104 does not generate a magnetic field to move the switching mechanism 103 from one state of equilibrium to the other is referred to as the latching period.

In a typical arrangement, internal construction of the magnetic latching relay 100 consists of a magnet on the switching mechanism 103. When the switching impulse current $I_S$ has reduced to zero and/or the electromagnetic device 104 no longer generates a magnetic field to move the switching mechanism 103, the magnet on the switching mechanism 103 maintains the switching mechanism 103 in its current state of equilibrium.

For example, in FIG. 1, if the switching mechanism 103 is initially in state SE0 where the pair of contacts 101 and 102 are not in electrical contact, the generated magnetic field due to the switching impulse current $I_S$ causes the switching mechanism 103 to move from state SE0 to state SE1, where the pair of contacts 101 and 102 are in electrical contact. When the switching impulse current $I_S$ reduces to zero, and the magnetic field is no longer generated by the electromagnetic device 104, the electrical contact between the pair of contacts 101 102 is maintained by the magnet on the switching mechanism 103.

During the latching period, the switching impulse current $I_S$ is zero, and the switching mechanism 103 is latched in one state of equilibrium. However, an external force applied to a structure on which the magnetic latching relay 100 is mounted may cause a movement of the switching mechanism 103. Depending on the magnitude of the external force, the switching mechanism 103 will move from one state of equilibrium to another state of equilibrium.

During test conditions for standards such as UL864, a device containing the magnetic latching relay 100 is mounted on a structure. If an external force is applied to the structure and the switching mechanism 103 moves from one state of equilibrium to another state of equilibrium during the latching phase, then the device will be deemed to have failed.

If the external force is applied to a structure supporting a device containing the magnetic latching relay 100 in a real-world scenario, then the switching of the magnetic latching relay 100 from one state to another could have numerous health and safety, and technical implications. For example, the switching from one state to another will result in the device not operating in its intended manner.

In the present invention, a relay protection device 200 is provided for use with the magnetic latching relay 100, as described previously, in order to prevent the undesirable switching of the switching mechanism 103 from one state of equilibrium to the other state of equilibrium as a result of an external force.

Figure 3:
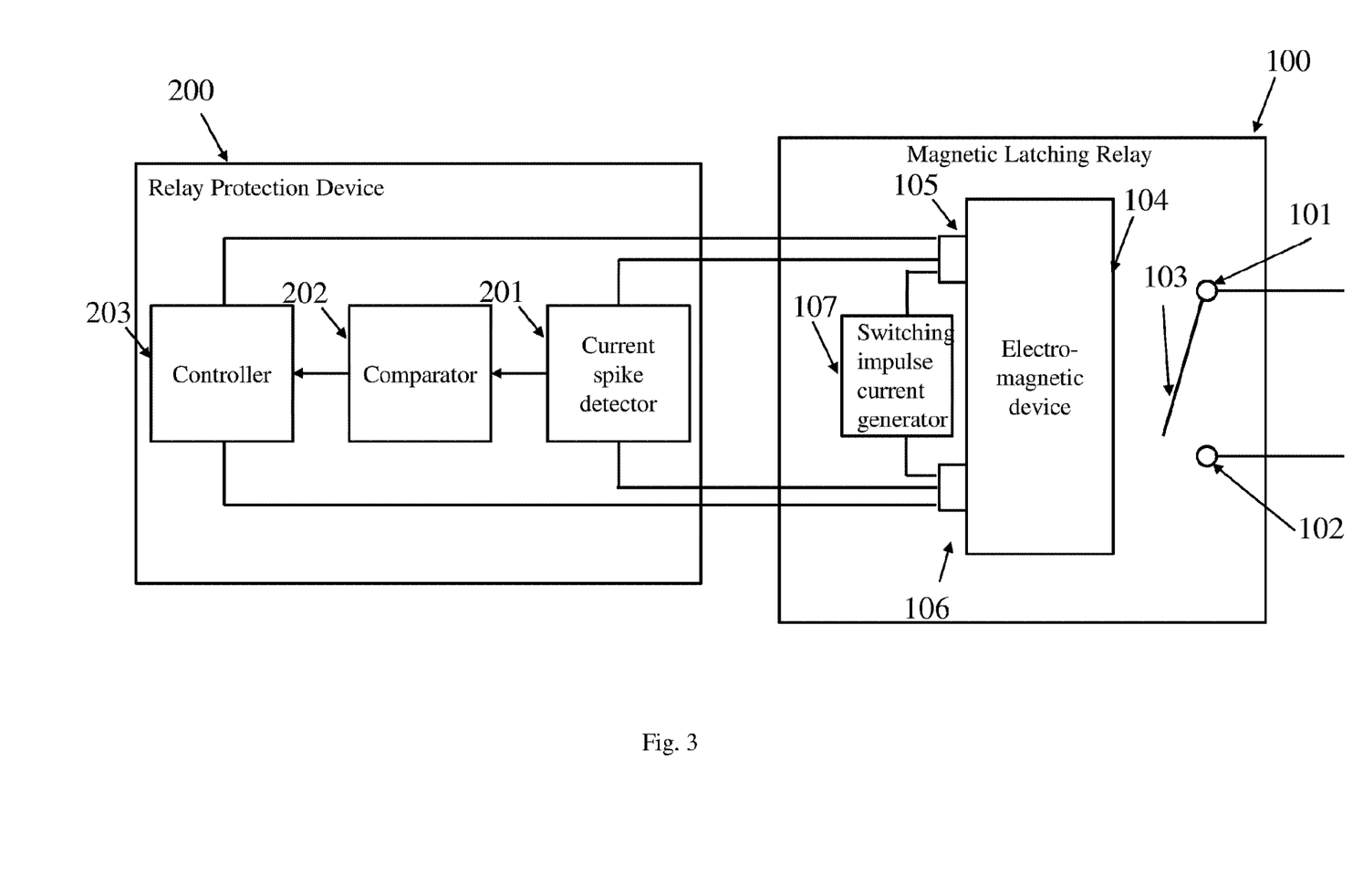
FIG. 3 shows an arrangement of a relay protection device with a magnetic latching relay, in accordance with an embodiment.

As illustrated in FIG. 3, the relay protection device 200 comprises a current spike detector 201, a comparator 202 and a controller 203. The relay protection device 200 coupled with the magnetic latching relay 100.

During a movement of the switching mechanism 103, for example due to an external force, the magnetic field of the magnet on the switching mechanism 103 also moves.

This moving magnetic field induces a current $I_1$ within at least one coil of the electromagnetic device. By monitoring this induced current $I_1$, it can be identified if the switching mechanism 103 is at risk of moving from one state of equilibrium to another state of equilibrium.

For example, the induced current $I_1$ manifests as a current spike before the switching mechanism 103 moves from one state to another state. Therefore, the current spike indicates that the switching mechanism 103 is at risk of moving from one state of equilibrium to another state of equilibrium.

Furthermore, by determining that the switching mechanism 103 is at risk of changing states, actions can be taken to prevent the change from one state of equilibrium to another state of equilibrium.

The current spike detector 201 of the relay protection device 200 connects with the electrical control contacts 105 106 of the magnetic latching relay 100 so as to measure the current induced $I_1$ in the electromagnetic device 104. In one arrangement, the current induced $I_1$ is determined by measuring the voltage across the electrical contacts 105 106 of the electromagnetic device 105, as illustrated in FIG. 3. In an alternative arrangement, the current induced $I_1$ is measured by using a current ammeter.

The comparator 202 determines if the measured induced current $I_1$ exceeds a predetermined threshold. The predetermined threshold is chosen as a value above which there is a likelihood that the movement of the switching 103 will result in the switching mechanism changing from the one state of equilibrium to another state of equilibrium.

The value chosen for the predetermined threshold is dependent on the type of magnetic latching relay 100 being used.

The controller 203 is connected to the electrical control contacts 105 106 of the magnetic latching relay 100. If the comparator 200 has determined that the measured induced current $I_1$ exceeds the predetermined threshold, then the controller 203 will apply a retention voltage $V_R$ across the electrical control contacts 105 106. The retention voltage $V_R$ causes the electromagnetic device 104 to generate a magnetic field and to retain the switching mechanism 103 in its current state.

The application of the retention voltage $V_R$ may involve the application of a retention current $I_R$ to the electrical control contacts 105 106.

Figure 4:
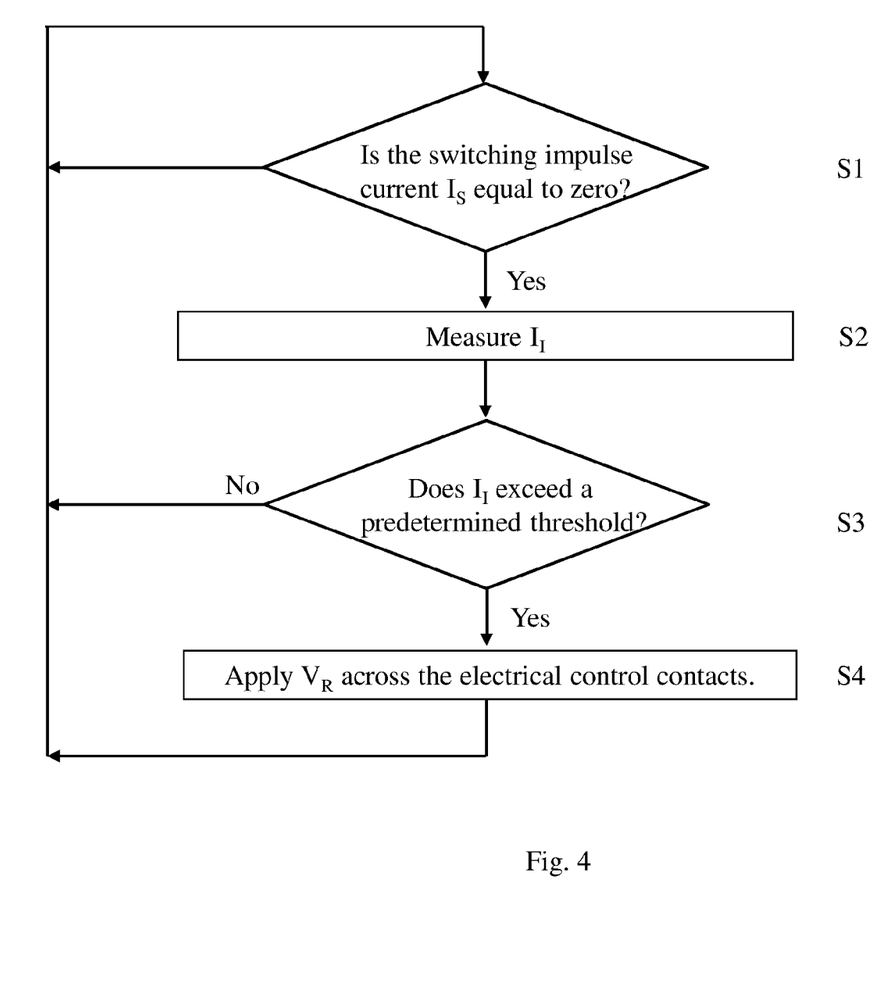
FIG. 4 outlines a method of protecting a magnetic latching relay, in accordance with a described embodiment.

FIG. 4 illustrates the steps performed by the relay protection device 200. The relay protection device 200 determines if the magnetic latching relay 100 is in a latching period (S1). This is achieved by determining if the switching impulse current $I_s$ is equal to zero.

If the magnetic latching relay 100 is determined not to be in a latching period, then S1 is repeated.

If the magnetic latching relay 100 is determined to be in a latching period, the current spike detector 201 of the relay protection device 200 measures the induced current $I_1$ in the electromagnetic device 104. In S3, the comparator 202 determines if the induced current $I_1$ exceeds the predetermined threshold.

If the induced current $I_1$ does not exceed the predetermined threshold, then S1 is repeated.

If the induced current $I_1$ exceeds the predetermined threshold, the controller 203 of the relay protection device 200 applies a retention voltage $V_R$ across the electrical control contacts 105 106 (S4). Then S1 is repeated.

The operation of the relay protection device 200 is further described with reference to FIG. 5a and FIG. 5b.

Figure 5A:
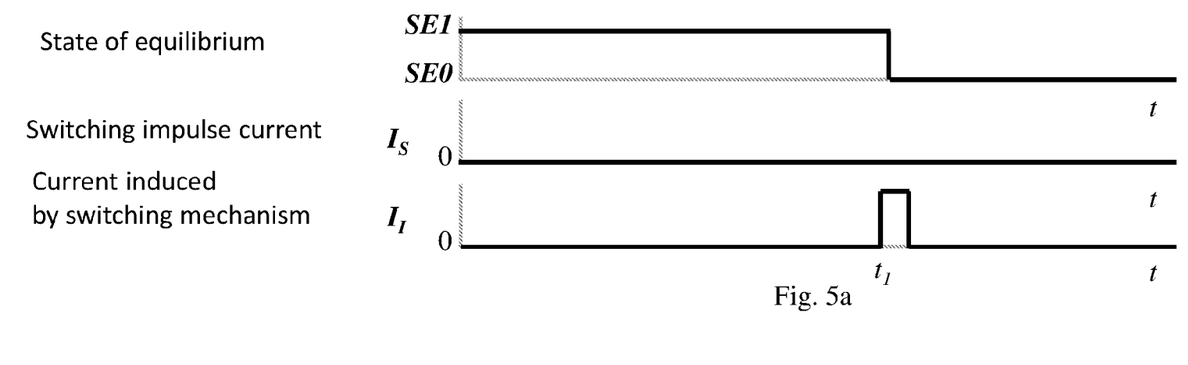
FIG. 5a illustrates graphs indicating currents exhibited in the circuitry of a magnetic latching relay, without the relay protection device, in initial condition in a first of two stable relay states.

FIG. 5a illustrates the operation of the magnetic latching relay 100 without the relay protection device 200. The magnetic latching relay 100 is mounted on a structure. The switching mechanism 103 is in a state of equilibrium SE1 and the pair of contacts 101 102 are in electrical contact. Furthermore, the magnetic latching relay 100 is in the latching phase and so the switching impulse current $I_S$ is zero.

If at time $t_1$, an external force is applied to the structure on which the magnetic latching relay 100 is mounted, the switching mechanism 103 may move. A movement of the switching mechanism will result in an induced current $I_1$ in the electromagnetic device 104, as described previously. The magnitude of the induced current $I_1$ will depend on the level of movement of the switching mechanism 103. If the force is of a sufficient level, it will cause the switching mechanism to move out of its latched position, i.e. state SE1, and into another state of equilibrium SE0, as shown in FIG. 5a.

If the external force is applied during test conditions to determine if a device containing the magnetic latching relay meets the requirements of the UL864 standard, then, in the situation illustrated in FIG. 5a, the device would have failed.

If the external force is applied to the structure supporting a device containing the magnetic latching relay 100 in a real-life scenario, then the switching of the magnetic latching relay 100 from one state to another could have numerous health and safety, and technical implications. For example, the switching from one state to another can result in the device not operating in its intended manner.

Figure 5B:
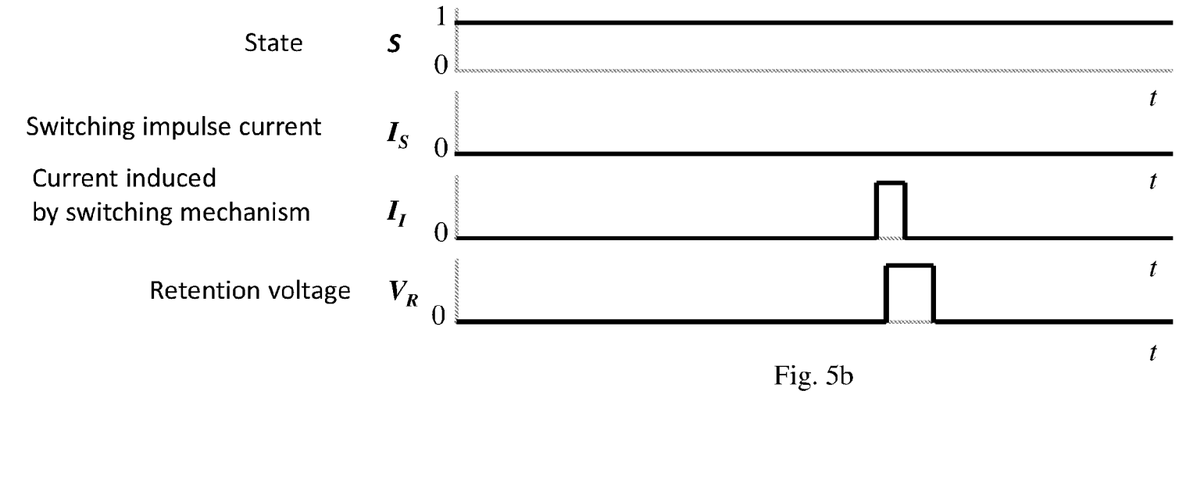
FIG. 5b illustrates graphs indicating currents exhibited in the circuitry of the arrangement illustrated in FIG. 3, with the magnetic latching relay, as per FIG. 5a, being in initial condition in a first of two stable relay states.

FIG. 5b illustrates the operation of the magnetic latching relay 100 when used with the relay protection device 200. The switching mechanism 103 is initially in a state SE1, and the pair of contacts 101 102 are in electrical contact. The magnetic latching relay 100 is in the latching phase and so the switching impulse current $I_S$ is zero.

If at time $t_1$, an external force is applied to the structure on which the magnetic latching relay 100 is mounted, the switching mechanism 103 may move. A movement of the switching mechanism 103 will result in an induced current $I_1$ in the electromagnetic device 104, as described previously. The magnitude of the induced current $I_1$ depends on the level of movement of the switching mechanism 103.

The current spike detector 201 of the relay protection device 200 measures the induced current $I_1$ during the latching phase of the magnetic latching relay 100, i.e. when the switching impulse current $I_S$ is zero.

The comparator 202 determines whether the induced current $I_1$ exceeds a predetermined threshold. The predetermined threshold is chosen as a value above which there is a likelihood that the movement of the switching mechanism 103 will result in the switching mechanism 103 changing from one state of equilibrium to another state of equilibrium. The value chosen for the predetermined threshold will be dependent on the type of magnetic latching relay 100 being used.

If the induced current $I_1$ exceeds the predetermined threshold, then the controller 203 generates a retention voltage $V_R$. The retention voltage $V_R$ is then applied across the electrical contacts 105 106 of the electromagnetic device 104. The retention voltage $V_R$ causes the electromagnetic device 104 to generate a magnetic field to retain the switching mechanism 103 in its current state of equilibrium, i.e. SE1, and prevents the switching mechanism from moving significantly so as to change to state SE2 wherein the electrical contacts are open.

The magnitude of the retention voltage $V_R$ and the duration of time that the retention voltage $V_R$ is applied across the electrical contacts 105 106 will depend on the type of magnetic latching relay 100 used.

Figure 6A:
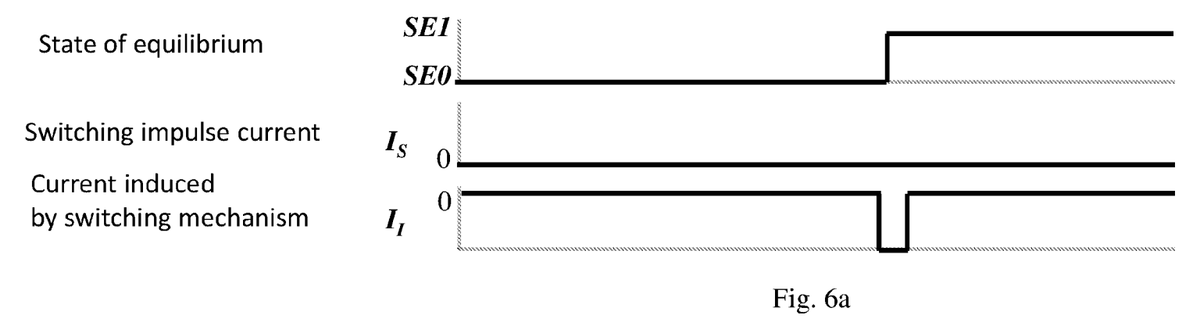
FIG. 6a illustrates the operation of a magnetic latching relay without the relay protection device in initial condition in a second of the two stable relay states.
Figure 6B:
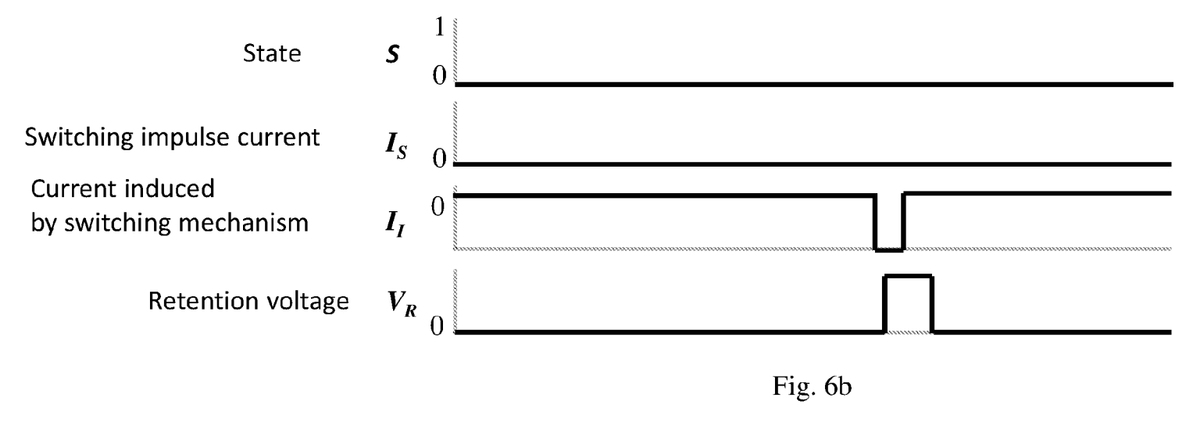
FIG. 6b illustrates graphs indicating currents exhibited in the circuitry of the arrangement illustrated in FIG. 3, with the magnetic latching relay, as per FIG. 6a, being in initial condition in a second of the two stable relay states.

The operation of the relay protection device 200 is further described with references to FIG. 6a and FIG. 6b.

FIG. 6a illustrates the operation of the magnetic latching relay 100 when the switching mechanism 103 of the magnetic latching relay 100 is initially in state SE0, and the pair of contacts 101 102 are not in electrical contact. The magnetic latching relay 100 is in its latching phase and so the switching impulse current $I_S$ is zero.

If at time $t_1$, an external force is applied to the structure on which the magnetic latching relay 100 is mounted, the switching mechanism 103 may move. A movement of the switching mechanism 103 will result in an induced current $I_1$ in the electromagnetic device 104, as described previously. However, as the movement of the switching mechanism is in a different direction than that described above with reference to FIG. 5a, the polarity of the induced current $I_1$ is negative.

Therefore, the magnitude of the induced current $I_1$ depends not only on the level of movement of the switching mechanism 103, but also on the direction of the movement.

FIG. 6b illustrates the operation of the magnetic latching relay 100 when used with the relay protection device 200. The switching mechanism 103 is initially in state SE0, and the pair of contacts 101 102 are not in electrical contact. The magnetic latching relay is in the latching phase and so the switching impulse current $I_S$ is zero.

If at time $t_1$, an external force is applied to the structure on which the magnetic latching relay 100 is mounted, the switching mechanism 103 may move. A movement of the switching mechanism 103 will result in an induced current $I_1$ in the electromagnetic device 104, as described previously. However, as the movement of the switching mechanism 103 is in a different direction than that described above with reference to FIG. 5a, the polarity of the induced current $I_1$ is negative.

The comparator 202 can thus determine not only whether the induced current $I_1$ exceeds a predetermined threshold, but it can also determine the direction of the movement of the switching mechanism 103 based on the polarity of the induced current The value chosen for the predetermined threshold will also be dependent on the direction of movement on the switching mechanism.

If the induced current $I_1$ exceeds the predetermined threshold, then the controller generates a retention voltage $V_R$. The retention voltage $V_R$ is then applied across the electrical contacts 105 106 of the electromagnetic device 104. The retention voltage $V_R$ causes the electromagnetic device 104 to generate a magnetic field to retain the switching mechanism 103 in its current state of equilibrium, i.e. SE0, and prevents the switching mechanism from moving significantly so as to change to the state SE1 wherein the pair of contacts 101 102 are in electrical contact.

The magnitude of the retention voltage $V_R$ and the duration of time that the retention voltage is applied across the electrical contacts 105 106 will further depend on the direct of movement of the switching mechanism 103.

The relay protection device 200 of the present invention prevents the undesirable switching of the switching mechanism 103 due to applied force to the structure on which the magnetic latching relay 100 is mounted. It achieves this by applying a retention voltage to maintain the state of equilibrium of the switching mechanism before the switching mechanism changes state.

Implementation of the relay protection device 200 can be low cost. Furthermore, the relay protection device 200 potentially allows for inexpensive relays to be used in devices subjected to UL864 tests, or in devices that may be subjected to forces while in use.

The reader will appreciate that the present disclosure is not limited to implementations to which UL864 tests or similar impact tests are relevant. It is also not limited to implementations of magnetic latching relays in fire protection systems. Magnetic latching relays may be implemented in a wide range of different fields, in various configurations. In addition, relays may be subjected to different types of mechanical force, instead of impact, which may risk the inadvertent flipping of the switching mechanism from one state to another.

While certain embodiments have been described, these embodiments have been presented by way of example only, and are not intended to limit the scope of the inventions. Indeed the novel methods and devices described herein may be embodied in a variety of other forms; furthermore, various omissions, substitutions and changes in the form of methods and devices described herein may be made. The accompanying claims and their equivalents are intended to cover such forms of modifications as would fall within the scope of the inventions.

The invention claimed is:

1. A relay protection device for use with a magnetic latching relay, the magnetic latching relay comprising a pair of contacts and a switching mechanism coupled with at least one of the contacts, the switching mechanism having two states of equilibrium, one of the states corresponding with the contacts being in electrical contact, the other corresponding to the contacts not being in electrical contact, and an electromagnetic device operable to urge, under the effect of a switching impulse current, the switching mechanism from one of the states of equilibrium to the other, the switching impulse current being supplied to the electromagnetic device via electrical control contacts, the relay protection device configured to determine if the magnetic latching relay is in a latching period by determining if the switching impulse current is equal to zero, the relay protection device comprising:

a current detector for connection with the electrical control contacts and operable to, if the switching impulse current is zero, measure a current induced by the switching mechanism;

a comparator operable to determine if the current exceeds a predetermined threshold; and a controller for connection with the electrical control contacts and, based on the determination of the comparator, operable to apply a retention voltage across the electrical control contacts so as to cause the electromagnetic device to generate a magnetic field to retain the switching mechanism in its current state.

2. The relay protection device of claim 1 wherein the current detector is operable to detect the current induced by the switching mechanism by measuring a voltage across the electrical control contacts.

3. The relay protection device of claim 1 wherein the switching mechanism comprises at least one magnet.

4. The relay protection device of claim 3 wherein a movement of the switching mechanism induces the current induced by the switching mechanism.

5. The relay protection device of claim 4 wherein a polarity of the current induced by the switching mechanism depends on a direction of the movement of the switching mechanism.

6. A method of providing relay protection in a magnetic latching relay, the magnetic latching relay comprising a pair of contacts and a switching mechanism coupled with at least one of the contacts, the switching mechanism having two states of equilibrium, one of the states corresponding with the contacts being in electrical contact, the other corresponding to the contacts not being in electrical contact, and an electromagnetic device operable to urge, under the effect of a switching impulse current, the switching mechanism from one of the states of equilibrium to the other, the switching impulse current being supplied to the electromagnetic device via electrical control contacts, the method comprising:

determining if the switching impulse current is zero;

if the switching impulse current is zero, measuring a current induced by the switching mechanism;

determining if the current exceeds a predetermined threshold; and based on the determination, applying a retention voltage across the electrical control contacts so as to cause the electromagnetic device to generate a magnetic field to retain the switching mechanism in its current state.

7. The method of claim 6 wherein the current induced by the switching mechanism is measured by measuring a voltage across the electrical control contacts.

8. The method of claim 6 wherein the switching mechanism comprises at least one magnet.

9. The method of claim 8 wherein a movement of the switching mechanism induces the current induced by the switching mechanism.

10. The method of claim 9 wherein a polarity of the current induced by the switching mechanism depends on a direction of the movement of the switching mechanism.

11. A magnetic latching relay operable to implement the method of claim 6.

* * * * *